(12) United States Patent
Lee et al.

(10) Patent No.: US 6,621,128 B2
(45) Date of Patent: Sep. 16, 2003

(54) METHOD OF FABRICATING A MOS CAPACITOR

(75) Inventors: David Lee, Hsinchu (TW); Chewnpu Jou, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/796,227

(22) Filed: Feb. 28, 2001

(65) Prior Publication Data

US 2002/0117705 A1 Aug. 29, 2002

(51) Int. Cl.$^7$ ................................................ H01L 29/76
(52) U.S. Cl. .......................... 257/369; 257/379; 257/532
(58) Field of Search ................................ 257/369, 371, 257/379, 296, 532, 408

(56) References Cited

U.S. PATENT DOCUMENTS

| | | | |
|---|---|---|---|
| 5,168,075 A | 12/1992 | Kuo | 437/52 |
| 5,703,806 A | 12/1997 | Puar et al. | 365/181 |
| 5,986,314 A | 11/1999 | Seshadri et al. | 257/402 |
| 6,433,398 B1 * | 8/2002 | Suzuki et al. | 257/392 |

* cited by examiner

Primary Examiner—Mark V. Prenty
(74) Attorney, Agent, or Firm—J. C. Patents

(57) ABSTRACT

A method of fabricating a MOS capacitor in a complementary MOS fabrication process with dual-doped poly gates comprises providing a substrate of a first conductive type, the substrate having a first well of the first conductive type and a second well of a second conductive type. A dielectric layer is formed on the substrate. A first poly gate of the first conductive type is formed on the dielectric layer over the first well and a second poly gate of the second conductive type is formed on the dielectric layer over the second well. A first doped region of the first conductive type is formed in the substrate at each side of the first poly gate. A second doped region of the second conductive type is formed in the substrate at each side of the second poly gate layer. A spacer is formed on sidewalls of the first poly gate and the second poly gate, wherein a portion of the dielectric layer is also removed to expose a portion of the first doped region and a portion of the second doped region. An implantation is performed on the exposed portion of the first doped region with dopants of the first conductive type, so as to form a first substrate electrode. An implantation process is performed on the exposed portion of the second doped region with dopants of the second conductive type to form a second substrate electrode.

11 Claims, 7 Drawing Sheets

METHOD OF FABRICATING A MOS CAPACITOR

BACKGROUND OF THE INVENTION

1. Field of the Invention

The invention relates in general to a method of fabricating a metal-oxide semiconductor (MOS) capacitor. More particularly, this invention relates to a method of fabricating a MOS capacitor on a doped region with the same dopant conductive type.

2. Description of the Related Art

In semiconductor fabrication, complementary metal-oxide semiconductor (CMOS) integrated circuit is a well known design. The CMOS device typically includes many p-type MOS transistors and n-type MOS transistors, which are formed in the corresponding wells in a substrate. Particularly, a dual-well design in CMOS includes wells with two conductive types, usually formed next to each other. The CMOS device needs not only the MOS transistors but also a capacitor. The capacitor usually is a MOS capacitor known in the conventional technologies as being disclosed in U.S. Pat. No. 5,703,806 and U.S. Pat. No. 5,168,075. However, the conventional MOS capacitor has some drawbacks due to its depletion effect in semiconductor materials, which affects performance of the CMOS device. A stable capacitance can only be achieved under small bias.

The conventional MOS capacitor typically only uses the overlapping region between the source/drain region and the gate electrode. This also causes additional fabrication process for photomask and implantation. The MOS capacitor is also incorporated in, for example, a mix mode circuit, where a dedicated capacitor with specific processes is further employed.

In a conventional MOS capacitor, the source and drain regions are shorted with each other as an electrode. The gate of the MOS transistor is used as the other electrode of the capacitor, while the gate oxide layer is used as the capacitor dielectric. FIG. 1A depicts a conventional N-type (NMOS) capacitor structure built in a P-well of a complementary metal-oxide semiconductor (CMOS) integrated circuit. Likewise, a P-type MOS (PMOS) capacitor is conventionally formed in an N-well. In FIG. 1A, generally, a MOS transistor includes a gate electrode typically having a gate oxide layer 106, a polysilicon layer 108, and a silicide layer 110. On the sidewall of the gate electrode, a spacer 112 is also formed. Under the spacer 112, an source/drain extension region 116 is formed in the substrate 100 at the well 104. The source/drain region 114 is formed in the substrate 100, with respect to the well 104, at each side of the gate electrode. For another well 105, another MOS transistor is accordingly formed. A conventional MOS capacitor is similar to a MOS transistor but the operation is different.

For the use as a capacitor, an additional implantation with the same conductive type as the well 104 under the gate oxide layer 106 is formed, so as to have lower bias on the capacitor.

Various capacitors exist in the conventional MOS capacitor of FIG. 1A. For example, the capacitors exists in the NMOS capacitor is depicted in FIG. 1B. A capacitor 118 exists between the gate oxide layer 106 and the polysilicon layer 108, resulting from the depletion effect. A capacitor 120 exists between the polysilicon layer 108 and the well 104 in the semiconductor substrate, the gate oxide layer 106 serves as the dielectric of the capacitor. If the well 104 is taken as one electrode of the capacitor, a capacitor 122 also exists near the interface between the gate oxide layer 106 and the well 104 of the substrate, due to depletion effect also. If the source/drain region is taken as one electrode, a capacitor 124 also exists between the polysilicon layer 108 and the source/drain region.

Moreover, the silicide layer 110 on top of the gate has its specific function. FIG. 1C is a top view, schematically illustrating MOS devices formed on the wells. When the MOS devices are formed in the wells with different conductive type. For example, a P well and an N well are typically formed abutting each other. A diode inherently exists between the well. In order to have proper connection between the MOS devices with being affected by the substrate diode effect, the silicide layer 110 is formed to connect the MOS devices. From the cross-section view, the silicide 110 is shown in FIG. 1A.

For the MOS device as shown in FIG. 2, an oxide layer O and a metal layer M are sequentially formed on a semiconductor substrate S, such as a P-type silicon substrate with a ground voltage. The gate voltage Vg can be applied on the metal M. The MOS device is also like a capacitor. When voltage Vg is zero or less than zero, holes are accumulated near the substrate surface under the oxide O. This is usually called as an accumulation mode. If the voltage is negative up to a certain level, the capacitance is about fixed. When voltage Vg is applied with higher quantity, a strong inversion starts to occur on the semiconductor surface. The minimum voltage to cause the strong inversion is called as the flat-band voltage. The flat-bang voltage depends on a work function of the semiconductor substrate. When the voltage Vg is greater than the flat-band voltage but is still not sufficiently high, a depletion phenomenon occurs, at which the holes are expelled in opposite direction and leaves a negative charge near the he substrate surface under the oxide O. A depletion capacitor then occurs. When the gate voltage Vg is great than a threshold voltage, the strong inversion completely occurs on the semiconductor surface under the oxide 0. For the MOS device, the threshold voltage is the bias level for the gate voltage to turn on the MOS device.

FIG. 3 shows a conventional drain current in a MOS transistor versus a drain voltage, with respect to different threshold voltage $V_T$. When the MOS device is turned on by applying the gate voltage greater than the threshold voltage, the drain current $I_d$ achieves a stable current when drain voltage Vd is greater than a certain quantity. However, when the drain voltage is small, a linear region occurs. The linear region provides applications for the MOS device.

In general, the MOS capacitor as shown in FIG. 1B can be operated in three modes:

1. When a gate bias is sufficiently high, that is, higher than the threshold voltage in MOS transistor operation, a two dimensional electron gas is generated near the substrate/oxide interface referred as an inversion layer. The electrons in the inversion layer are conducted to electrodes through the $N^+$ implanted source/drain regions. In this operation mode, a high quality fixed capacitance from the gate oxide layer 106 is provided.

2. When the gate bias voltage is between the threshold voltage and a flat-band voltage, certain depth of the substrate is depleted under the gate electrode, and thus forming a variable capacitor 122. Usually, the lightly doped P-type ($P^-$) substrate electrode is not connected through the heavily doped N-type ($N^+$) source/drain regions, a high series resistance occurs with the substrate picking up the connection certain distance away. This operation mode is called the depletion mode operation.

3. When the gate bias voltage is below the flat-band voltage, the hole accumulates under the gate electrode and this mode of operation also experiences higher series resistance while trying to connect the P⁻ substrate electrode through well pickup contact.

For the conventional MOS capacitor, when the capacitor is set under the depletion mode, it has several disadvantages. In this situation, the conventional MOS capacitor experiences high series resistance in depletion mode since one of the capacitor electrodes is the substrate, which has to be picked up through the substrate contact at certain distance away. The high series resistance gives rise the effects of:

1. The RC time constant of the MOS capacitor and this parasitic resistor gives the a low-pass frequency response limiting the applicable frequency range of the MOS variable capacitor structure; and 2. Even within the applicable frequency range of this MOS variable capacitor structure, a higher parasitic resistance gives rise to higher signal power loss and hence results in a lower quality factor.

SUMMARY OF THE INVENTION

A method of fabricating a metal-oxide semiconductor (MOS) capacitor in a complementary MOS fabrication process with dual-doped poly gates, the method comprising providing a substrate of a first conductive type, the substrate having a first well of the first conductive type and a second well of a second conductive type. A dielectric layer is formed on the substrate. A first poly gate of the first conductive type is formed on the dielectric layer over the first well and a second poly gate of the second conductive type is formed on the dielectric layer over the second well. A first doped region of the first conductive type is formed in the substrate at each side of the first poly gate. A second doped region of the second conductive type is formed in the substrate at each side of the second poly gate layer. A spacer is formed on sidewalls of the first poly gate and the second poly gate, wherein a portion of the dielectric layer is also removed to expose a portion of the first doped region and a portion of the second doped region. An implantation is performed on the exposed portion of the first doped region with dopants of the first conductive type, so as to form a first substrate electrode. An implantation process is performed on the exposed portion of the second doped region with dopants of the second conductive type to form a second substrate electrode.

In the foregoing, a first channel region in the first well under the first poly gate is implanted by dopants of the first conductive type, so as to form a first channel implantation region. A second channel region in the second well under the second poly gate is implanted by dopants of the second conductive type, so as to form a second channel implantation region. The channel implantation regions can reduce the applied electrode bias of the MOS capacitor.

In the depletion mode operation, the substrate electrode is directly connected to the doped regions through the channel implantation region with resistivity much lower than well resistance experienced by the conventional structure.

The invention further provides a MOS capacitor with a gate used as an electrode, the gate oxide layer used as a capacitor dielectric, and a substrate doped region used as the other electrode of the capacitor. The substrate doped region is formed in the substrate at each side of the gate electrode like a source/drain region for a MOS transistor but the conductive type is different. The substrate doped region has the same conductive type as that of the substrate.

The foregoing general description and the following detailed description are exemplary and explanatory only and are not restrictive of the invention, as claimed.

DESCRIPTION OF THE PREFERRED EMBODIMENTS

In the invention, a MOS capacitor is fabricated by a method similar to the formation of a MOS transistor in a CMOS fabrication but the conductive type of dopants is the same as the conductive type of the substrate or well where the MOS capacitor resides. For example, in an N-well or a lightly doped N-type substrate, an NMOS capacitor is formed. Or alternatively, in a P-well or a lightly doped P-type substrate, a PMOS capacitor is formed.

Figure 4A:
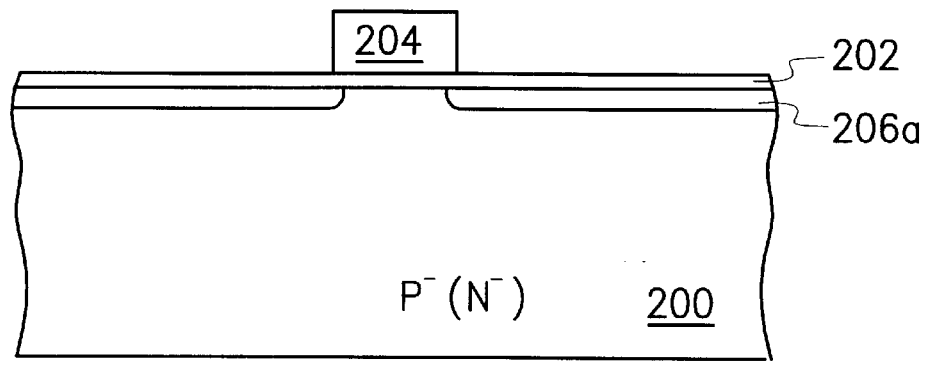
FIGS. 4A–4C are cross sectional views, schematically illustrating a fabrication process for fabricating a MOS capacitor, according to a preferred embodiment of the invention.
Figure 4B:
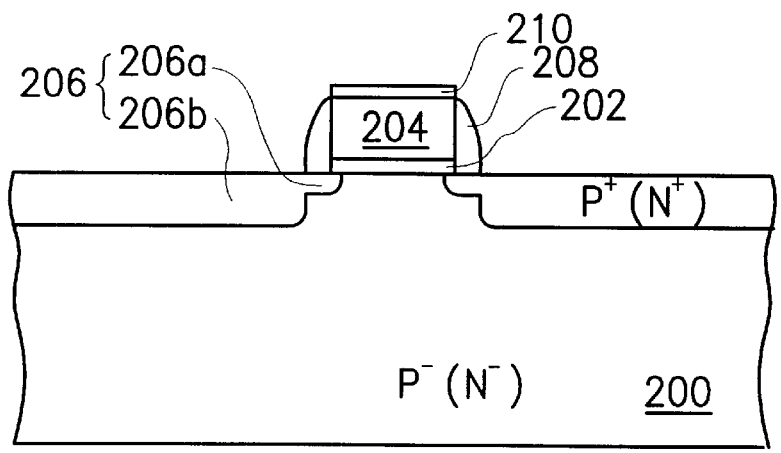
Figure 4C:
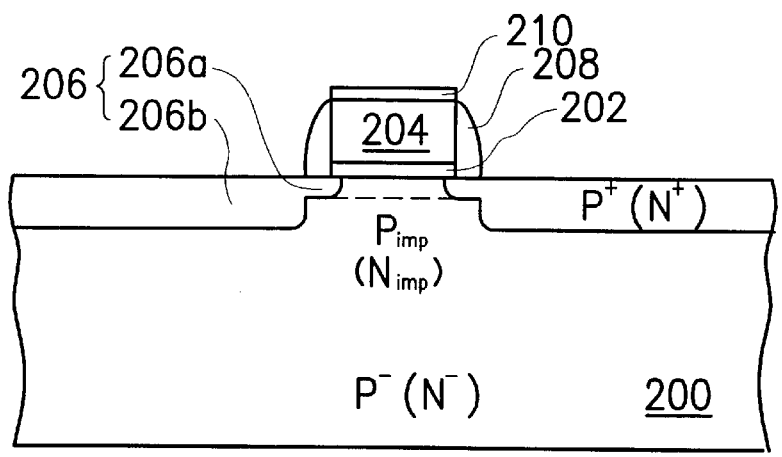

FIGS. 4A–4C are cross sectional views, schematically illustrating a fabrication process for fabricating a MOS capacitor, according to a preferred embodiment of the invention. In FIG. 4A, a doped area 200, for example, a substrate or a well lightly doped with a conductive type dopant, for example, a P-type or an N-type dopant, is provided. A dielectric layer 202, such as a gate oxide layer, is formed on the area 200. A conductive layer, such as a polysilicon layer, is formed on the gate oxide layer 202 and is patterned into a gate layer 204. During patterning the conductive layer, the gate oxide layer may be also patterned. However, this is a fabrication choice. In this example, the gate oxide layer remains to protect the substrate. Using the gate layer 204 as a mask, a doped region 206a is formed in the substrate at each side of the gate layer 204. The doped region 206a has the same conductive type as the doped area 200. This is different from the method for forming a MOS transistor because the dopant conductive type is different.

Usually, a thermal treatment is performed to diffuse dopants in the doped region 206a to have better concentration distribution. The doped region 206a may extend to have an overlapping portion with the gate layer 204.

In FIG. 4B, a spacer 208 is formed on a sidewall of the gate layer 204 by, for example, forming an oxide layer over the substrate and etching back the oxide layer and the gate oxide layer 202. Using the gate layer 204 with the spacer 208 as a mask, the doped area 200 is further implanted with dopants having the same conductive type as the doped area 200 but higher concentration than the doped area 200 and the doped region 206a of FIG. 4A. A doped region 206b is formed in the substrate at each side of the gate layer 204 with the spacer 208. A portion of the doped region 206a under the spacer 208 is the doped extension region. The doped regions 206a and 206b serve together as a substrate electrode 206.

From the fabrication point of view, the doped regions 206a and 206b are similar to a source/drain region and a source/drain extension region in the NOS transistor but the dopant conductive type is different. Therefore, the MOS capacitor of the invention needs no extra patterning process. The essential part is arranging the implantation process with the desired dopant conductive type. The structure shown in FIG. 4B can be formed by a method like the steps for fabricating a digital mode circuit but choosing the desired dopant type. Moreover, in order to have higher dopant concentration in the substrate electrode, every implantation step at the other portion of the digital circuit can also applied to the MOS capacitor at the region needing the same type dopant. For example, when a P-type implantation is performed at other place of an IC, the P-type implantation is also applied to the doped region 206 and the gate layer 204 at the P-type doped area 200. Similarly, an N-type implantation process is performed for implanting the IC at the other portion, the NMOS capacitor with in N well is also implanted. Usually, the dopant concentration is higher, the depletion capacitor is reduced. If the gate layer 204 has high concentration, the depletion capacitor existing in the gate layer 204 can be effectively reduced.

Furthermore, a silicide layer 210, such as a titanium silicide, is formed on the gate layer 204. The silicide layer 210 can avoid a diode effect between two wells as described in FIG. 1C.

In FIG. 4C, a channel implantation is further performed to form a channel implantation region, $P_{imp}$ ($N_{imp}$), as denoted by the dashed line under the gate oxide layer 202. Again, dopants with the same conductive type but higher concentration than the area 200 is implanted into the channel region of the doped area 200. The channel implantation region is formed to reduce an electrode bias for operating the MOS capacitor.

In general, the channel implantation region $P_{imp}$ can also be formed before the gate layer 204 is formed. However, if the channel implantation region is formed after the gate layer 204 is formed, the dopant implanting energy is set to be able to penetrate the gate layer 204. The channel implantation is like the implantation for threshold voltage adjustment.

Figure 1A:
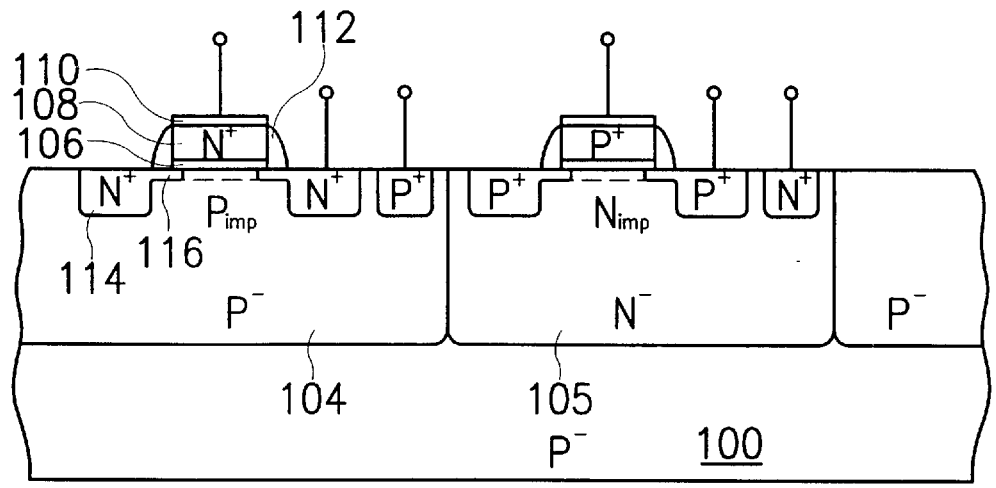
FIG. 1A illustrates a cross-sectional view of a conventional MOS capacitor in a CMOS integrated circuit.
Figure 1B:
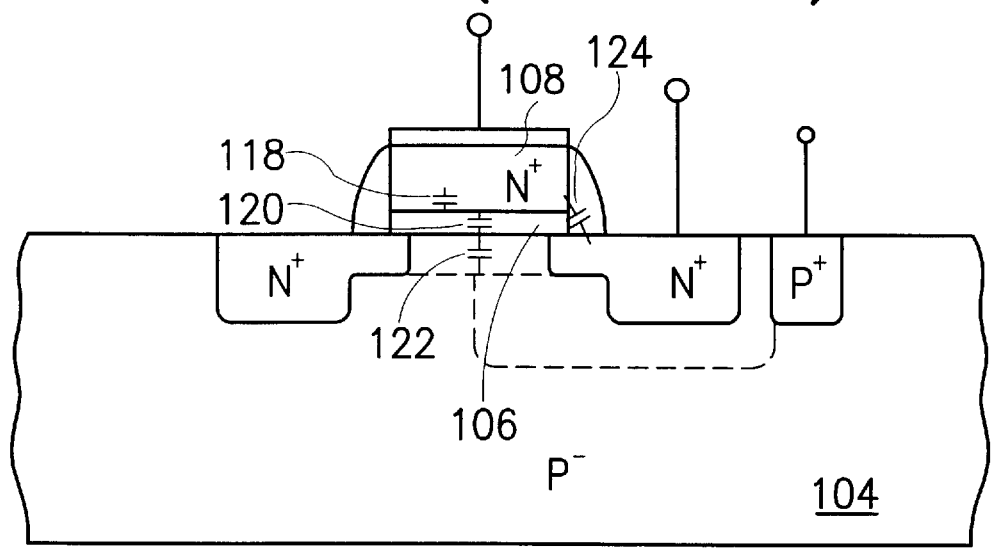
FIG. 1B illustrates a cross-sectional view of a conventional NMOS capacitor in FIG. 1A, showing the capacitor's mechanism.
Figure 1C:
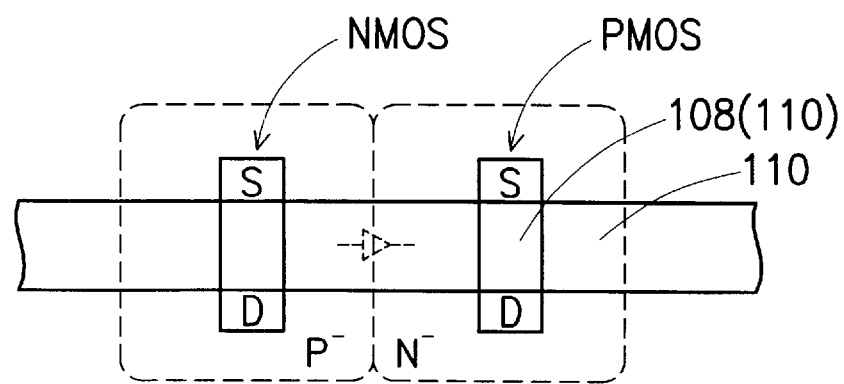
FIG. 1C illustrates a top view of a CMOS device with an NMOS device and a PMOS device having a silicide layer on top of the gate electrode.
Figure 2:
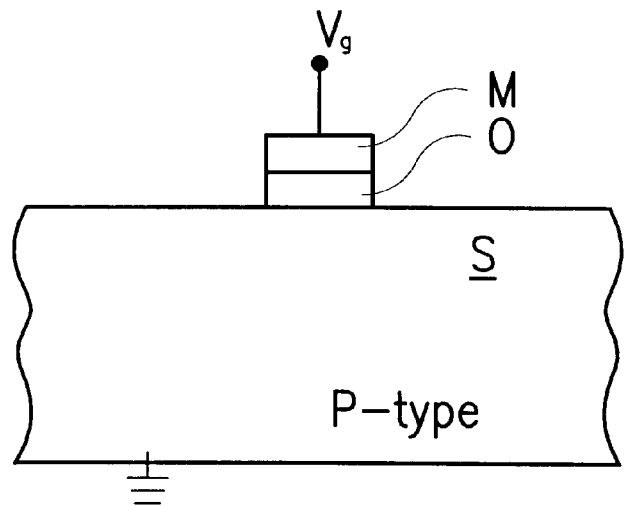
FIG. 2 illustrates a cross-sectional view of a conventional MOS device.
Figure 3:
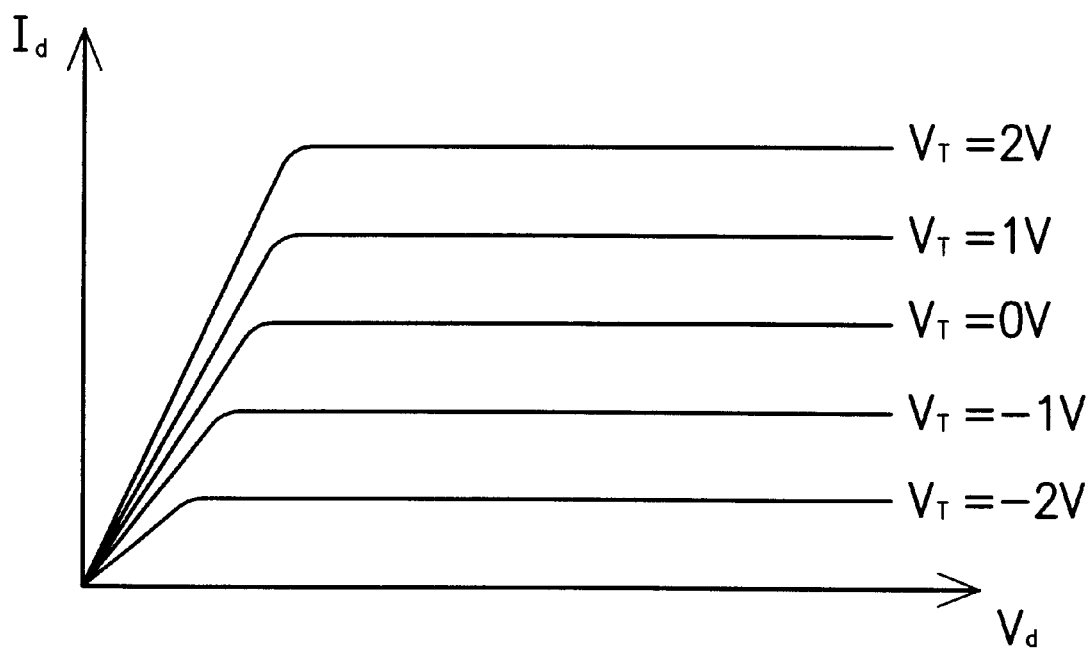
FIG. 3 illustrates curves of drain current Id varying with the a drain voltage of a MOS transistor with respect to various threshold.

The structure of FIG. 4C can be fabricated by a method similar to the method for fabricating a MOS transistor but the dopant type. One essential feature of the invention is that a MOS capacitor is formed on a doped area, both of which have the same conductive type, such as a PMOS capacitor formed on a P-well/substrate and an NMOS capacitor formed on an N-well/substrate. In this manner particularly to a depletion mode operation, the substrate doped region 206 and the well/substrate 200 have the same conductive type. The substrate dope region 206 serves as one electrode of the MOS capacitor, while the gate layer 204 serves as the other electrode. The doped area 200 and the substrate doped region 206 then experience a smaller parasitic resistance than the conventional parasitic resistance as shown in FIG. 1A. The RC time constant is effectively reduced.

The method provided by the invention as drawn in FIGS. 4A–4C does not require additional fabrication process or photomasks more than fabricating a conventional MOS transistor. By doping the same dopant conductive type on the substrate doped regions and the channel region, the series parasitic resistor coupled to the MOS capacitor is greatly reduced. The dependency of the capacitance upon the gate bias is eliminated. As a result, the drawbacks due to the dependency of the gate bias are resolved.

Figure 5:
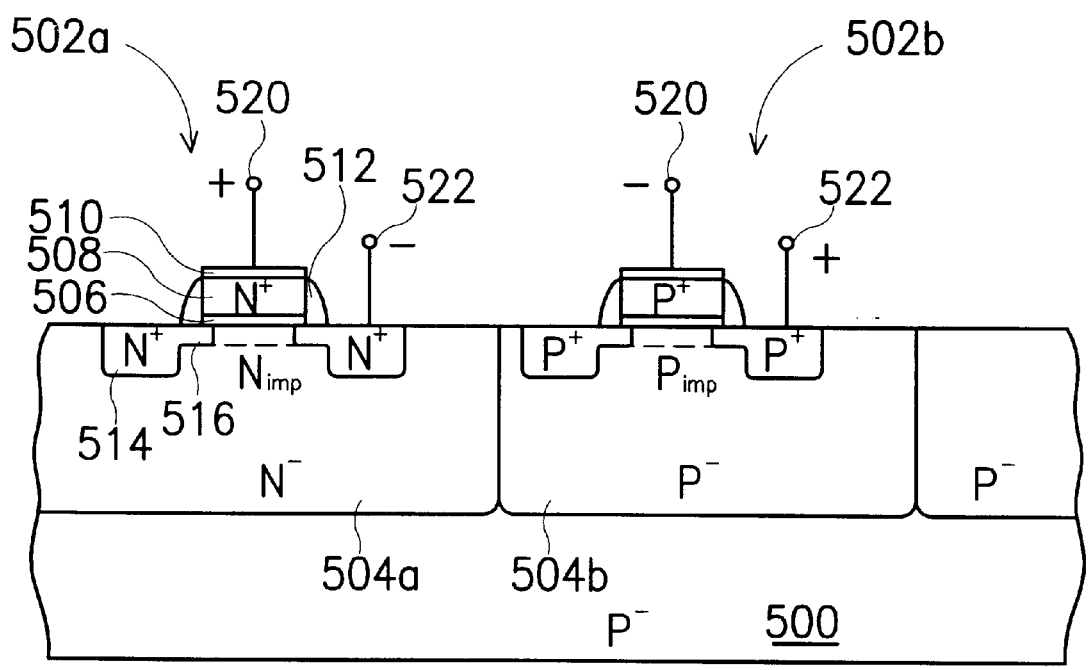
FIG. 5 is a cross-sectional view, schematically illustrating a MOS capacitor of the invention in a CMOS device with a dual poly gate structure, according to a preferred embodiment of the invention.

FIG. 5. is a cross-sectional view, schematically illustrating a MOS capacitor of the invention in a CMOS device with a dual poly gate structure. In FIG. 5, a lightly doped P-type (P$^-$) substrate 500 is provided. A N$^-$ well 504a and a P$^-$ well 504b are formed in the substrate 500. An NMOS capacitor 502a is formed on the N well 504a and a PMOS capacitor 502b is formed on the P well 504b. The channel implantation regions of the NMOS 502a and the PMOS 502b are formed by a channel implantation step with N-type dopants and P-type dopants. The channel implantation regions are denoted as $N_{imp}$ and $P_{imp}$ in the P-well 504a and the P-well 504b, respectively. The substrate electrode 522 includes doped regions 514, and 516. The gate electrode 520 includes gate layer 508 and the silicide layer 510. The capacitor's dielectric is the gate oxide layer 506.

Figure 6:
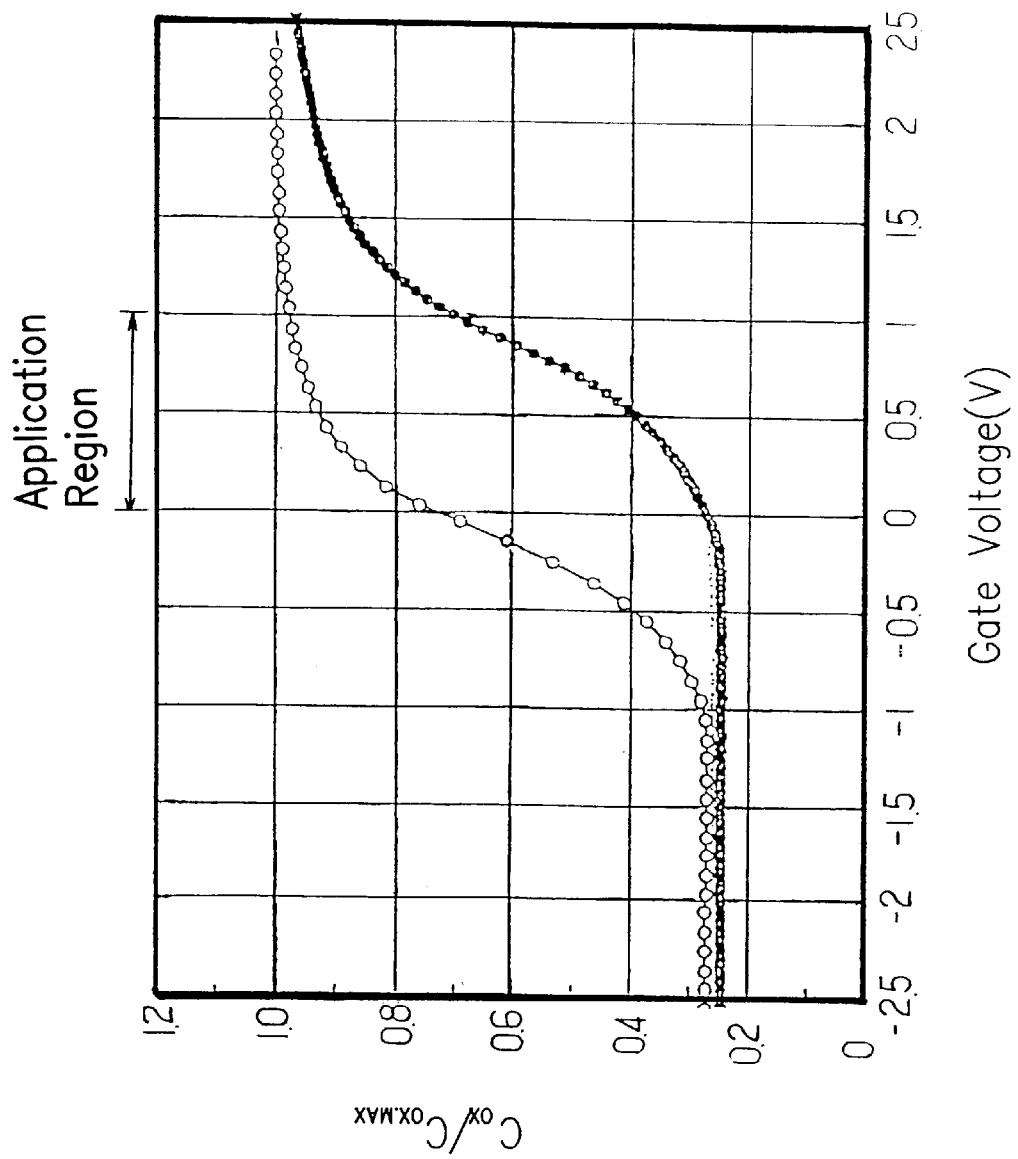
FIG. 6 is a capacitance curve of the MOS capacitor varying with the applied gate voltage, according to a preferred embodiment of the invention.
Figure 7A:
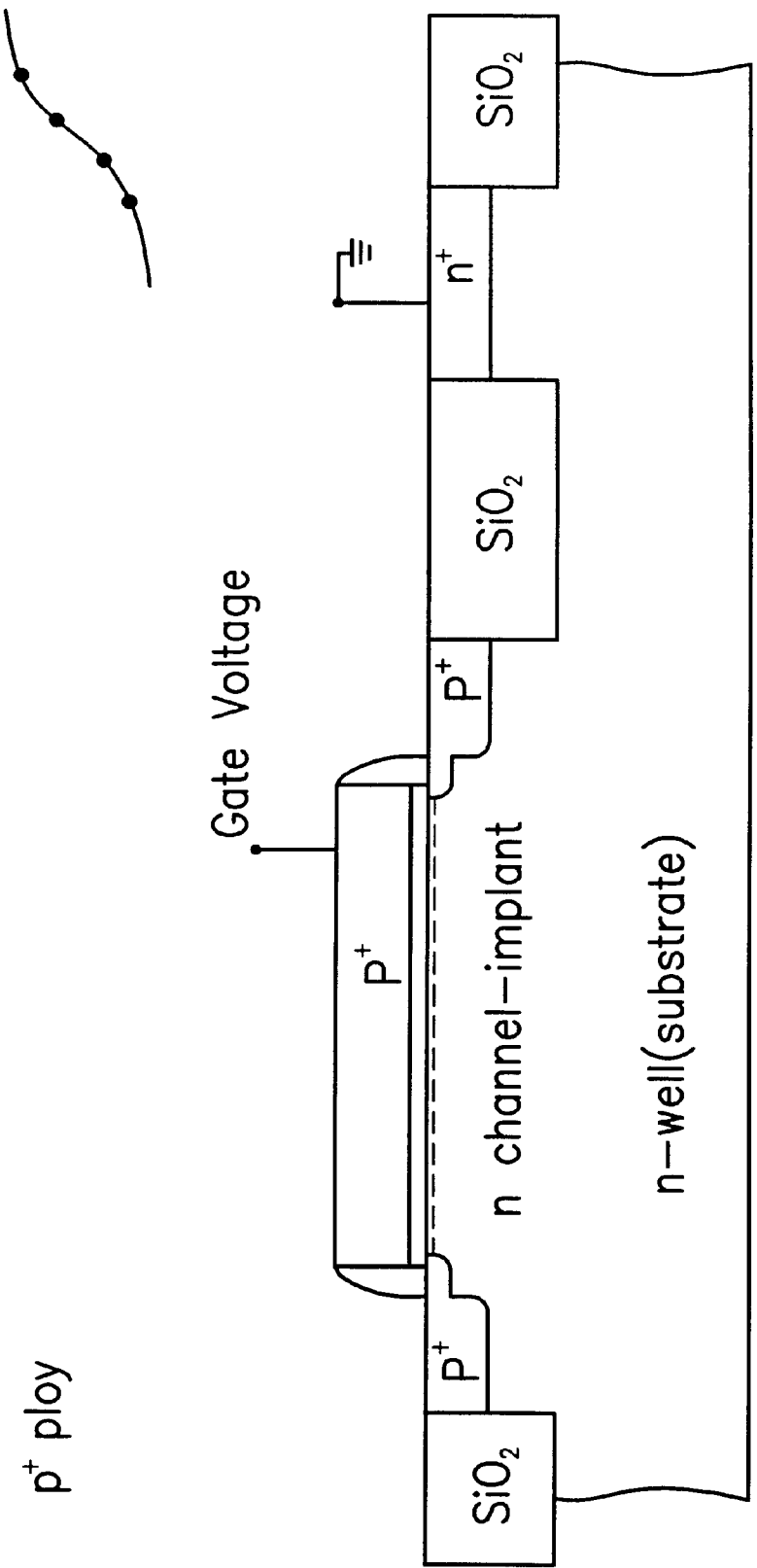
FIGS. 7A–7B are cross-sectional views, schematically illustrating the circuits used to obtain the curves in FIG. 6, according to the preferred embodiment of the invention.
Figure 7B:
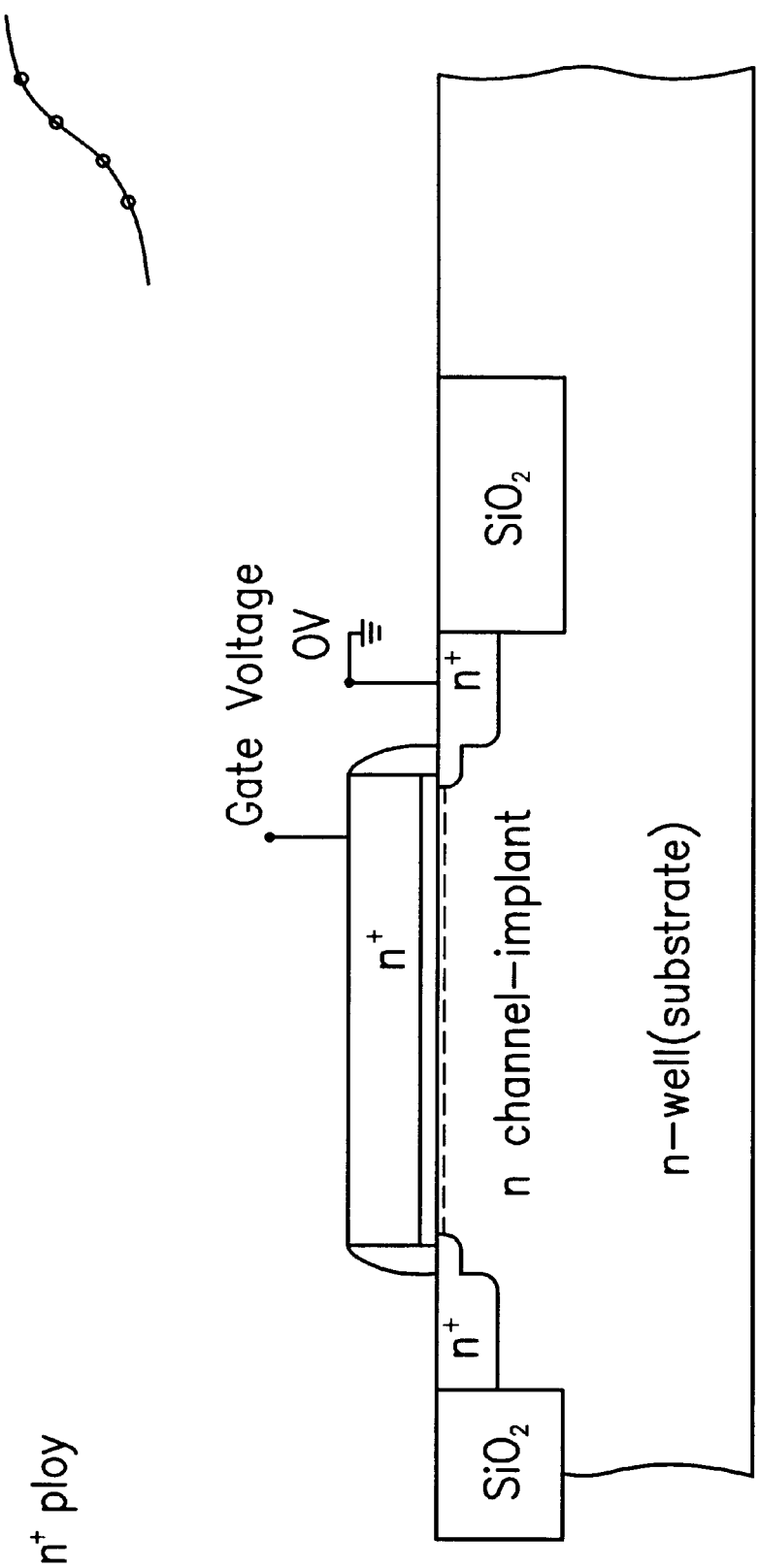

The MOS capacitor has the applications at the linear region. FIG. 6 shows a C-V curve of the MOS capacitor varying with the applied gate voltage, according to a preferred embodiment of the invention. In FIG. 6, the open-circle line is the capacitance of the NMOS capacitor of the invention. The open-circle line shows the data actually measured according to the circuit as shown in FIG. 7B. The solid-circle line is the capacitance of the conventional NMOS capacitor measured by the circuit as shown in FIG. 7A. The gate oxide layer, for example, is about 53–55 angstroms. The conventional MOS capacitor in solid-circle line has a flat band voltage about at zero volt, and cannot effectively achieve a stable fixed capacitance when the gate voltage is applied high. For example, when gate voltage is at 2.5 volt, the capacitance ratio is about 0.95, clearly still less than 1. This is due to the depletion effect.

In FIG. 5 and FIG. 6, the invention make use the region with the gate voltage greater than zero for the NMOS capacitor, such as about 0–1 volts. Due to the specific doping arrangement with the same conductive type, the work function effectively reduces the flat band voltage. The flat band voltage of the invention, as shown by the open-circle line, about reduced down to the −1.05 volts. Moreover, the capacitance can effectively achieve the maximum. When a positive bias is applied on the gate electrode 520 of the NMOS capacitor 502a, a better linearity is obtained. This allows the MOS capacitor to be easily operated at the linear region, since the zero volt of gate voltage has been away from the flat band voltage, and near the linear region. For the application region with the gate voltage greater than about zero volt, such as 0–1 volts, the linear region is easily achieved.

To have the linear region, the electrode electric polarities for the MOS capacitors in FIG. 5 are shown. Preferably, a positive bias is applied on the gate electrode 520 of the NMOS capacitor 502a, while the substrate electrode 522 is set to be the relative negative or ground bias. Similarly for the PMOS capacitor 520b, a positive electrode 522 is referred to the substrate electrode 522, while the negative electrode is referred to the gate electrode 520.

Further still, a nonlinear region for the MOS capacitor can be obtained by reversing the electrode polarities, if the nonlinear region is desired in another circuit design. Also and, the invention is also suitable for use in triple well structure.

In the foregoing, the semiconductor conductive type of the MOS capacitor can be reversed as well known in the prior art. The features of the invention still remains.

In conclusion, the invention provides a MOS capacitor, which is formed on a doped well or a substrate having the same conductive type. This allows the doped region to serve as one electrode of the MOS capacitor. The parasitic resistance is greatly reduced. As a result, the MOS capacitor has less unstable effects from the AC frequency and the operational voltage on the electrodes.

The MOS capacitor provided by the invention can thus be applied in frequency tuning circuits of radio frequency (RF) voltage controlled oscillator (VCO) in most wireless transceivers, tunable RF filters widely used in television (TV) and frequency modulation (FM) radio receivers, as well as some frequency agile low pass filters in audio/video signal processing circuits.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A metal-oxide semiconductor (MOS) capacitor in a complementary MOS (CMOS) device, the MOS capacitor, comprising:
    a substrate of a first conductive type, having a first well of the first conductive type and a second well of a second conductive type;
    a first MOS capacitor of the first conductive type formed the substrate at the first well, wherein the first MOS capacitor comprises:
        a first substrate electrode of the first conductive type in the first well;
        a first dielectric layer on the first substrate electrode; and
        a first gate electrode of the first conductive type on the first dielectric layer; and
    a second MOS capacitor of the second conductive type formed on the substrate at the second well, wherein the second MOS capacitor comprises:
        a second substrate electrode of the second conductive type in the second well;
        a second dielectric layer on the second substrate electrode; and
        a second gate electrode of the second conductive type on the second dielectric layer.

2. The MOS capacitor according to claim 1, wherein the first conductive type is a P-type and the second conductive type is an N-type.

3. The MOS capacitor according to claim 2, wherein the first gate electrode serves as a negative electrode and the first substrate electrode as a positive electrode, and the second gate electrode serves as a positive electrode and the second substrate electrode serves as a negative electrode.

4. The MOS capacitor according to claim 1, wherein the first conductive type is an N-type and the second conductive type is a P-type.

5. The MOS capacitor according to claim 4, wherein the first gate electrode serves as a positive electrode and the first substrate electrode serves as a negative electrode, and the second gate electrode serves as a negative electrode and the second substrate electrode serves as a positive electrode.

6. The MOS capacitor according to claim 1, wherein the first substrate electrode comprises a first channel doped region of the first conductive type under the first dielectric layer.

7. The MOS capacitor according to claim 1, wherein the second substrate electrode comprises a second channel doped region of the second conductive type under the second dielectric layer.

8. A layout of a complementary metal-oxide semiconductor (CMOS) circuit, having a P-well implantation mask, an N-well implantation mask, an active region forming mask, a gate forming mask, an N-type implantation mask, and a P-type implantation mask, whereby an NMOS transistor and a PMOS transistor are respectively formed on a P-type dope region and an N-type doped region in the CMOS circuit, the improvement of the layout which comprises:
    using the same masks but different implantation types arranged to form at least
    an NMOS capacitor in an N-type dope region of a substrate, comprising an N-type active region with an N-type gate electrode thereon, and an N-type junction electrode beside the N-type gate electrode, and
    at least a PMOS capacitor in a P-type dope region of the substrate, comprising a P-type active region with a P-type gate electrode thereon, and a P-type junction electrode beside the P-type gate electrode.

9. The improvement of the layout of claim 8, wherein the P-type junction electrode and the N-type junction electrode each are formed including an extension doped region.

10. The improvement of the layout of claim 8, wherein the P-type active region and the N-type active region are formed including a same type channel-implantation region respectively under the P-type gate electrode and the N-type gate electrode.

11. The improvement of the layout of claim 8, wherein the N-type gate electrode of the NMOS capacitor serves as a positive-bias electrode, and the P-type gate electrode of the PMOS capacitor serves as a negative-bias electrode.

* * * * *